Nov. 22, 1966 O. STEEN 3,287,663
THYRISTOR OSCILLATOR
Filed June 3, 1965
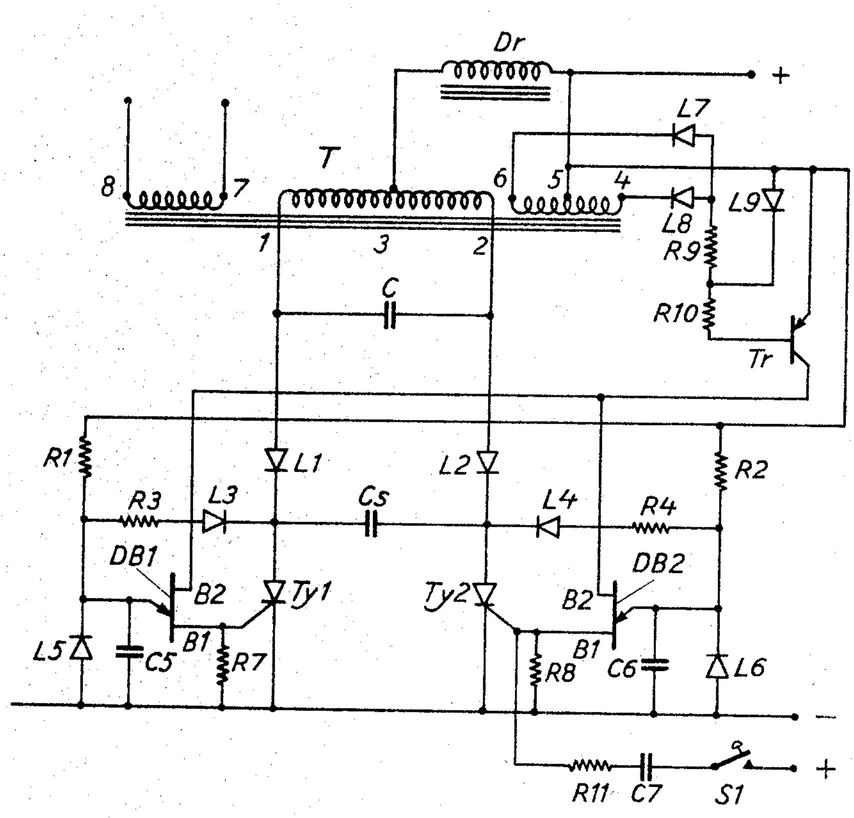
INVENTOR.
ÖYVIND STEEN
BY Hane and Nydick
ATTORNEYS

United States Patent Office 3,287,663

Patented Nov. 22, 1966

3,287,663

THYRISTOR OSCILLATOR

Oyvind Steen, Bandhagen, Sweden, assignor to Telefonaktiebolaget L M Ericsson, Stockholm, Sweden, a corporation of Sweden Filed June 3, 1965, Ser. No. 461,064
Claims priority, application Sweden, July 17, 1964, 8,725/64
1 Claim. (Cl. 331—111)

The present invention refers to an arrangement in oscillators in which the oscillating circuit comprising a condenser connected in parallel to a first winding of a transformer, a direct voltage source and a coil connected between said source and said oscillating circuit for keeping the direct current constant and two thyristors connected to said oscillating circuit for commutating the feeding voltage to said oscillating circuit, from which through a second winding of said transformer a sinusoidal voltage is obtained.

In telephone systems, signals with low frequency are necessary for instance for buzzer and ringing signalling. As many devices must be supplied with these signals it is necessary that the signal generating arrangement generates a sufficiently high effect. With electronic arrangements a transistor oscillator with an accompanying power amplifier has been used. As the amplifier is usually working in the class B area, the arrangement has, however, not produced a sufficiently high efficiency. To manufacture a transistor oscillator producing higher outputs has proved to be very difficult as the included components are very sensitive to excess voltages.

The purpose of the present invention is therefore to achieve an oscillator arrangement with voltage tolerant components and with high efficiency and furthermore low cost of production. According to the invention this is achieved by an arrangement with thyristors which is characterized thereby that for striking the thyristors one base of a double base diode is connected to a striking electrode of each thyristor, a striking condenser is connected between the cathode of the thyristor and the emitter of said double base diode, and a diode in series with a resistance is connected between the anode of the thyristor and said emitter. On each of said double base diodes the other base electrode is connected to the collector of a transistor included in a circuit connected to said oscillating circuit, said circuit being so arranged that the transistor will be blocked during a time period when the sine wave voltage obtained in the oscillating circuit passes its reference line. To quench the thyristors a quenching condenser is connected between the anodes of the thyristors and for dissipating the overall charge in the quenching condenser a diode is connected in parallel to each of said striking condenser, which diode being arranged together with said series connected diode and resistance and said quenching condenser to constitute a discharge circuit for said overall charge.

The invention will be further described in connection with the attached drawing, on which an oscillator is shown with an arrangement according to the invention. The oscillator comprises an oscillating circuit consisting of a condenser C connected in parallel to a winding 1–2 of a transformer T, which also is provided with a winding 7–8 for feeding the voltage obtained in the oscillating circuit to the output of the arrangement. The winding 1–2 has a center tap 3 connected through a coil D*r* to the positive pole of a direct voltage source. The terminals 1 and 2 of the transformer T are connected to the negative pole of the voltage source, respectively, through a diode L1 in series with a thyristor Ty1 and through a diode L2 in series with a thyristor Ty2. Between this negative pole and the striking electrodes of the thyristors resistance R7 and R8, respectively, are connected. The striking electrodes of the thyristors are also connected to one base of a double base diode DB1 and DB2, respectively. The emitter of DB1 is connected through a striking condenser C5 in parallel with a diode L5 to the negative pole of the direct voltage source and the emitter of DB2 is connected through a striking condenser C6 in parallel with a diode L6 to the same pole of said source. Further the emitter is connected to the anode of the respective thyristor through a resistance R3 in series with a diode L3 and a resistance R4, respectively, in series with a diode L4. Between the anodes of the thyristors there is connected a quenching condenser C*s*. The other base of the double base diodes DB1 and DB2 is connected to the collector of the transistor T*r*. The emitter of this transistor is connected to the positive pole of the direct voltage source and to a center tap 5 of a second winding 4–6 of the transformer T. The terminals 4 and 6 are connected by diodes L7 and L8, between the connecting points of which and the base of the transistor T*r* the resistances R9 and R10 are connected in series. Between the connection point between these resistances and the terminal 5 is also connected a diode L9. To start the oscillator, the starting electrode of the thyristor Ty2 is connected to a so-called starting link, which consists of a resistance R11 in series with a condenser C7 and a make contact S1 which is connected to the positive pole of the direct voltage source.

The oscillator is started by closing the contact S1. Just before the start there are present the following static conditions in the oscillator. The anodes of the thyristors Ty1 and Ty2 have a positive potential through the diodes L1 and L2 respectively and the coil D*r*. The transistor T*r*1 is blocked and further there is negative potential on the bases B2 of the double base diodes DB1 and DB2. Furthermore the emitter of the two double base diodes has negative potential. When closing the contact S1, a positive voltage pulse is obtained through the starting link which pulse is supplied to the striking electrode of the thyristor Ty2, whereby this thyristor strikes. The terminal 2 of the transformer T will hereby obtain negative potential and consequently the battery voltage will be in series with coil D*r* through the winding 2–3 of the transformer.

Through the winding 2–3 is now generated a sine voltage with the top value $\pi/2$ of the battery voltage. From the winding 2–3 this voltage is transformed by means of the windings 4–5 and 5–6. The voltage obtained in these windings is rectified by the rectifiers L7 and L8 and is then cut off at the passage through a resistance R9 and diode L9. The cut off voltage is supplied to the transistor T*r*1 through the resistance R10. Resistance R10 and diode L9 are so dimensioned that the transistor is entirely conductive at the cut off voltage. The transistor T*r*1 will therefore be blocked only during a short time period about the zero passage point of the sine voltage. When the transistor is entirely conductive the battery voltage will be at the bases B1 and B2 of the double base diodes. Hence, the striking condenser C5 begins to be charged during the first half period of the sine voltage while the condenser C6 is prevented from being charged owing to the fact that the thyristors Ty2 and the diode L4 are conductive, and therefore the current through the resistance R2 will pass through resistance R4, diode L4 and thyristor Ty2 to zero instead of to the condenser C6. The condenser C*s* is charged through the diodes L1 and L2 to a voltage which is equal to the $\pi$ of the battery voltage.

When the obtained sine voltage at first passes the reference line the transistor Tr will be blocked. The condenser C5 will then be discharged over the emitter and the base B1 of the double base diode DB1 and the striking electrode of the thyristor Ty1 to minus. This means that the thyristor Ty1 is struck whereby the voltage over the condenser Cs will be transferred to the thyristor Ty2. This voltage then lies in the back direction of the thyristor Ty2, that is with minus potential on the anode, whereby the thyristor Ty2 will be quenched. The overall charge in the condenser Cs will be discharged through the thyristor Ty1, the diode L6, the resistance R4 and the diode L4.

When the sine voltage has passed its reference a voltage of opposite polarity is obtained in the winding 1–3 of the transformer T. As a result, the cycle is repeated in the same way as during the first half period, that is when the transistor this time is entirely conductive the condenser C6 begins to be charged instead of the condenser C5, which is prevented from being charged due to the fact that the current is instead conducted through the resistance R3, the diode L3 and the thyristor Ty1. At passage through the reference line the transistor Tr is blocked as before and the condenser C6 is discharged over the double base diode DB2 and the thyristor Ty2. The thyristor Ty2 is then struck. The condenser Cs which has earlier obtained a charge of opposite polarity in relation to the first half period will have its voltage transferred to Ty1 and it will thereby lie in the back direction of this thyristor, which means that the thyristor Ty1 will be quenched. The overall charge of the condenser Cs is this time discharged through a series circuit, which consists of the thyristor Ty2, the diode L5, the resistances R3 and the diode L3.

The cycle is thereafter repeated again during the next half period of the sine voltage. The sine voltage obtained in the transformer T is then taken out as mentioned above through the winding 7–8 of the transformer.

I claim:

An arrangement in oscillators in which the oscillating circuit comprises a condenser connected in parallel with a first winding of a transformer, a direct current voltage source and a coil connected between said source and said oscillating circuit for maintaining the direct current constant and two thyristors are connected to said oscillating circuit for commutating the feeding voltage to the oscillating circuit, from which through a second winding of said transformer a sinusoidal voltage is obtained, characterized thereby, that for striking the thyristors one base electrode of a double base diode is connected to a striking electrode of each thyristor between the cathode of the thyristor and the emitter of said double base diode is connected a striking condenser, and between the anode of the thyristor and said emitter is connected a diode in series with a resistance and in each of said double base diodes the other base electrode is connected to the collector of a transistor included in a circuit connected to said oscillating circuit, said circuit being so arranged that the transistor will be blocked during a time period when the sine wave voltage obtained in the oscillating circuit passes its reference line, and for the quenching of the thyristors and for the dissipation of the overall charge in the quenching condenser a diode is connected in parallel to each of said striking condenser, which diode being arranged together with said series connected diode and resistance and said quenching condenser to constitute a discharge circuit for said overall charge.

No references cited.

ROY LAKE, *Primary Examiner.*

J. KOMINSKI, *Assistant Examiner.*